United States Patent [19]

McMahon

[11] Patent Number: 5,307,240
[45] Date of Patent: Apr. 26, 1994

[54] CHIPLID, MULTICHIP SEMICONDUCTOR PACKAGE DESIGN CONCEPT

[75] Inventor: John F. McMahon, Phoenix, Ariz.

[73] Assignee: Intel Corporation, Santa Clara, Calif.

[21] Appl. No.: 985,209

[22] Filed: Dec. 2, 1992

[51] Int. Cl.$^5$ .............................................. H05K 7/00
[52] U.S. Cl. .................................... 361/728; 361/760; 361/767; 361/809; 361/810; 174/52.2; 174/255; 257/690; 439/69; 439/74
[58] Field of Search ............... 361/380, 392, 394, 399, 361/400, 402, 403, 418, 419, 411, 420, 728, 730, 752, 760, 765, 767, 808, 809, 810; 174/52.2, 52.3, 52.4, 255, 256, 259; 257/678, 686, 690, 692; 439/69, 74

[56] References Cited

U.S. PATENT DOCUMENTS 5,157,588 10/1992 Kim et al. ........................... 361/396

FOREIGN PATENT DOCUMENTS 56-40268 4/1981 Japan ..................................... 357/80

*Primary Examiner*—Leo P. Picard
*Assistant Examiner*—Young Whang
*Attorney, Agent, or Firm*—Blakely Sokoloff Taylor & Zafman

[57] ABSTRACT

An electronic package assembly which has a first electrical device mounted to a housing and a second electrical device attached to the lid of the package. The first and second devices are completely encapsulated by the lid and housing, and are typically coupled to a printed circuit board by pads on the bottom surface of the package. The electrical devices may be active or passive elements that are coupled together by conductive pads located on the top and bottom surfaces of the housing and lid, respectively. The conductive pads are typically soldered together when the lid is attached to the housing.

5 Claims, 2 Drawing Sheets

CHIPLID, MULTICHIP SEMICONDUCTOR PACKAGE DESIGN CONCEPT

BACKGROUND OF THE INVENTION

1. Field of the Invention

The present invention relates to an electronic package assembly.

2. Description of the Related Art

Electrical devices are typically housed in a protective plastic or ceramic package. The package has leads which can be soldered to a printed circuit board to electrically couple the electrical device to the board. A typical ceramic package includes a lid that is attached and sealed to a housing. Before the lid is attached to the housing, the package and electrical device are tested to detect any defects in the package or device. Some packages contain multiple electrical devices so that if one device is defective the whole package must be replaced or repaired. It would be desirable to have an electronic package that physically separates some of the electrical devices, so that the devices can be individually tested and repaired.

The electrical devices generate heat which must be removed from the package. Mounting additional devices into the package typically increases the heat density of a package and the junction temperature of the devices. The heat density can be reduced by increasing the size of the package and separating the devices. Separating the devices increases the length of the interconnecting wires and the impedance between the devices. High impedance is typically undesirable, particularly for high speed circuits. Enlarging the housing increases the footprint of the package and the size of the board. It would therefore be desirable to have a multichip package that is thermally efficient and has desirable electrical characteristics.

SUMMARY OF THE INVENTION

The present invention is an electronic package assembly which has a first electrical device mounted to a housing and a second electrical device that is attached to the lid of the package. The first and second devices are completely encapsulated by the lid and housing, and are typically coupled to a printed circuit board by pads or leads on the bottom surface of the package. The electrical devices may be active or passive elements that are coupled together by conductive pads located on the top and bottom surfaces of the housing and lid, respectively. The conductive pads are typically soldered together when the lid is attached to the housing.

The first and second devices are individually tested before the lid is attached to the housing. If one of the devices is defective, the defective lid or housing assembly can be replaced without replacing the other assembly. The present invention therefore provides an electronic package with a relatively high yield rate. The present invention also allows the first or second device to be replaced or repaired without subjecting the other device to the elevated temperatures and tooling that are typically required to correct a defective device. The attachment of the second device to the lid also provides an additional heat sink that improves the overall thermally efficiency of the package. Additionally, the compact arrangement of the package minimizes the wire length between the devices.

Therefore it is an object of the present invention to provide a multichip electronic package that allows at least two of the chips to be separately tested, and replaced or repaired.

It is also an object of the present invention to provide a conventional electronic package that can contain more than one electrical device without reducing the thermal efficiency or electrical characteristics of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
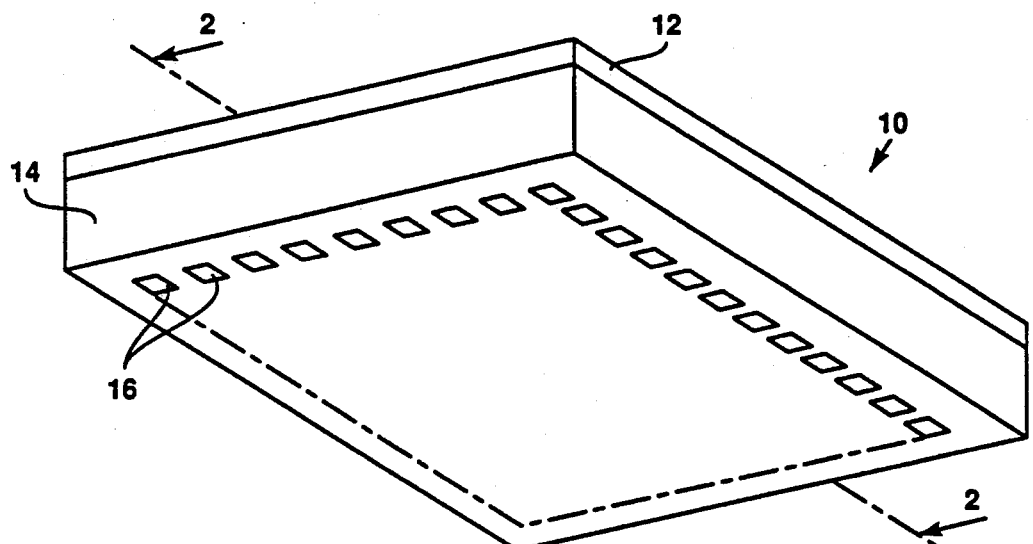
FIG. 1 is a perspective view of an electronic package of the present invention.
Figure 2:
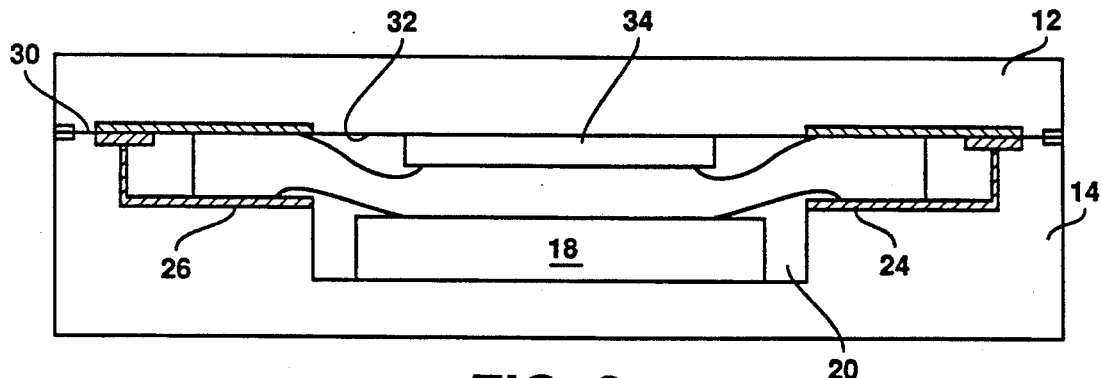
FIG. 2 is a cross-sectional view of the package, taken at line 2—2. of FIG. 1.
Figure 3:
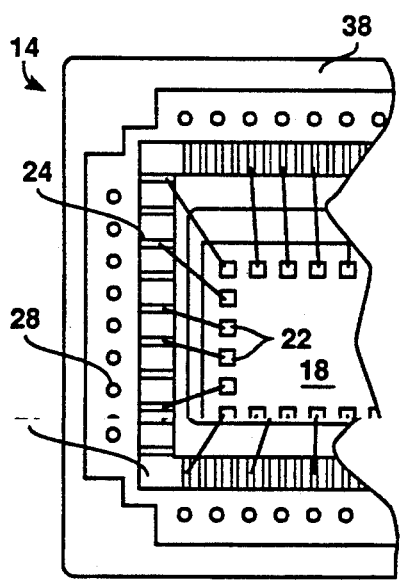
FIG. 3 is a top cross-sectional view of the package of FIG. 1.

Referring to the drawings more particularly by reference numbers, FIGS. 1-3 show a multichip electronic package 10 of the present invention. The package 10 includes a lid 12 attached to a housing 14. The housing 14 and lid 12 are typically constructed from a ceramic or other dielectric material. The package 10 has a plurality of leads 16 that can be soldered to a printed circuit board (not shown), so that the package is mechanically and electrically coupled to the board. Although the multichip electronic package 10 is shown with surface pads extending along the bottom of the housing 14, it is to be understood that the package 10 may have gull wing leads, pins, or any other means of coupling the electronic package to the board.

A first electrical device 18 is mounted to the housing 14. The device 18 is typically located within a first cavity 20 formed in the housing 18. The first electrical device 18 is typically an integrated circuit. The integrated circuit typically has outer surface pads 22 that are coupled to surface pads 24 on an inner shelf 26 of the housing 14. The pads 22 and 24 are typically coupled by wire bonding techniques known in the art. The pads 24 are connected to the leads 16 of the package 10, so that the integrated circuit 18 is coupled to the printed circuit board. The package 10 also has a plurality of surface pads 28 on the top surface 30 of the housing 14. The surface pads 28 may be coupled to the surface pads 24 and/or the leads 16 of the package 10.

Figure 4:
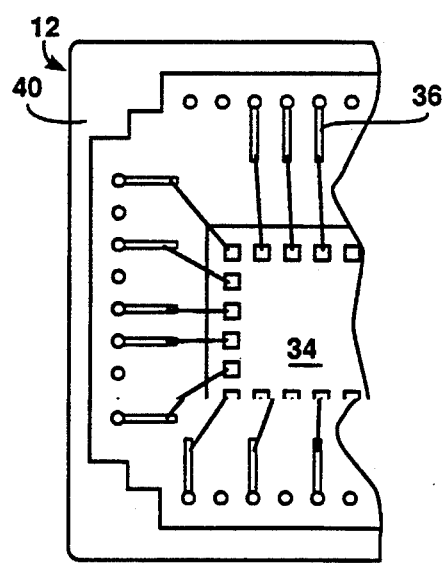
FIG. 4 is a bottom view of the lid of the package of FIG. 1.

As shown in FIG. 4, attached to the bottom surface 32 of the lid 12 is a second electrical device 34. The second electrical device 34 is coupled to a plurality of surface pads 36. The second device 34 may also be an integrated circuit that is wire bonded to the surface pads 36 on the bottom surface 32 of the lid 12. The surface pads 36 of the lid 12 are arranged in the same pattern as the surface pads 28 of the housing 14, so that the pads are adjacent to each other when the lid 12 is placed onto the top surface 30. The pads 28 and 36 are typically soldered together to provide an interconnect between the second electrical device 34 and the housing 14. The top surface 30 of the housing 14 may also have an outer metalized area 38 that mates with an outer metalized layer 40 of the lid 12. The metalized areas 38 and 40 are typically soldered together to seal the cavity 18 and the electrical devices 18 and 34.

Figure 5:
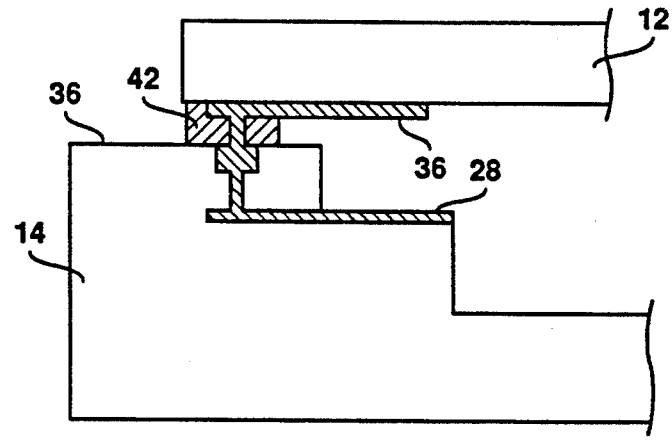
FIG. 5 is a cross-sectional view of an alternate embodiment of the package.

FIG. 5 shows an alternate embodiment, wherein the surface pads 36 are raised from the bottom surface 32 and separated by dielectric material 42 that extends around the circumference of the lid 12. In such an embodiment, the dielectric material 42 seals the pads 28 and 36, and the electrical devices from the environment.

Figure 6:
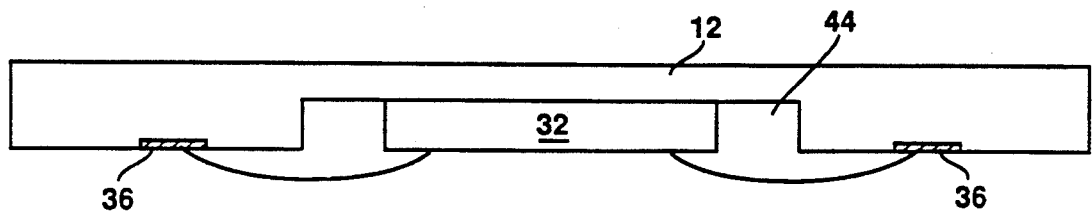
FIG. 6 is a cross-sectional view showing an alternate embodiment of the lid of the package.

FIG. 6 shows an alternate embodiment of the package, wherein the second electrical device 32 is mounted into a second cavity 44 formed into the lid 12. The second electrical device 32 could be a coprocessor or a memory chip that communicates with the first processor 18 through the pads 28 and 36. The present invention thus allows a processor to operate with a memory chip without sending signals through a printed circuit board as is typically done in the art. Such an arrangement reduces the length of the transmission lines and the overall impedance seen by the electrical signals. Locating the electrical devices 18 and 32 on separate substrates 12 also increases the overall thermal efficiency of the package 10. The package may have thermal fins, attached to the lid 12 to further increase the thermal performance of the package 10. As an alternate embodiment, the lid 12 may also have external leads 16 so that both the housing 14 and the lid 12 can be mounted onto separate printed circuit boards.

Figure 7:
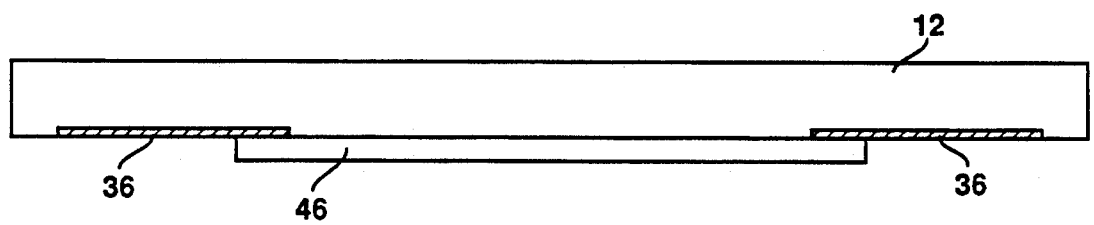
FIG. 7 is a cross-sectional view of an alternate embodiment of the lid.

FIG. 7 shows an alternate embodiment of the package, wherein the second electrical device consist of one or more resistors or capacitors 46. The resistors or capacitors 46 are preferably constructed by depositing a resistive or capacitive material onto the lid 12, such processes are typically referred to as thick film or thin film. The resistors/capacitors 46 can provide impedance control for the first electrical device 18. In an alternate embodiment, the resistors/capacitors 46 can be combined with one or more integrated circuits mounted onto the lid 12. Additionally, it is to be understood that the housing 14 may contain one or more integrated circuits and other electrical devices including thick/thin film resistors and capacitors.

To assembly the package 10, the electrical devices 18 and 32 are first attached or formed into the housing 14 and lid 12, respectively. The electrical devices 18 and 32 are then tested to determine whether any defects exist in either device/substrate assembly. The package of the present invention allows the devices to be separately tested, so that if one device is defective, the faulty device can be repaired or replaced without having to replace or repair the other device. The present package therefore provides a significant advantage over multichip packages of the prior art, which had all of the devices mounted to the housing. With packages of the prior art, the whole package would typically be replaced if one of the devices was defective. The present invention reduces the amount of non-defective parts that must be replaced and therefore increases the yield of the package 10.

After the devices are tested, preformed solder is then applied to the metal pads 36 of the lid 12. Solder may also be applied to the metalized area 40 for packages incorporating such a seal. The paste is typically applied with a template (not shown) with holes that match the pattern of the metalized areas. The lid 12 is then attached to the housing 14 and the solder is reflowed to connect the pads 28 and 36, and the metalized areas 38 and 40.

For packages incorporating the dielectric seal shown in FIG. 5, a glass powder with has a low transition temperature can be applied to the lid 12 or housing 14 before the solder is reflowed The transition temperature of the glass is low enough to reflow with the solder, so that the glass attaches and seals the lid 12 to the housing 14, when the pads 28 and 36 are coupled by the solder. The lid 12 is typically hermetically sealed in a dry inert ambient to prevent water from becoming trapped within the cavity of the package 10. What is therefore provided is a high yield, low cost, thermally efficient multichip carrier.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package assembly, comprising:
   a housing having a first cavity and a plurality of first conductive pads located on a top surface of said housing;
   a first electrical device attached to said housing within said first cavity and coupled to said first conductive pads;
   a lid attached to said housing so that said fist cavity is encapsulated by said lid and housing, said lid further having a plurality of second conductive pads on a bottom surface of said lid;
   a second electrical device attached to said lid and encapsulated by said housing and said lid; and,
   a plurality of conductive vias coupled to said first and second pads and encapsulated by a dielectric material which seals said lid to said housing.

2. The assembly as recited in claim 1, wherein said first electrical device is coupled to said second electrical device through said conductive pads.

3. The assembly as recited in claim 1, wherein said dielectric material has liquid transition temperature that is approximately equal to a reflow temperature of a solder.

4. The assembly as recited in claim 1, wherein said second electrical device is located in a second cavity in said lid.

5. A method for assembling an electronic package assembly, comprising the steps of:
   a) providing a housing that has a first electrical device located in a first cavity within said housing, said housing further having a plurality of first conductive pads on a top surface of said housing;
   b) providing a lid that has a second electrical device and a plurality of second conductive pads on a bottom surface of said lid;
   c) applying solder preform material to said second conductive pads;
   d) placing said housing onto said lid such that said first conductive pads are adjacent to said second conductive pads;
   d) apply a dielectric material to said lid in a manner to encircle said solder preform material;
   f) heating said housing and lid until said solder and said dielectric material reflow to a liquid state; and
   g) cooling said housing and lid such that said reflowed solder solidifies and attaches said first and second conductive pads and said dielectric solidifies to seal said lid to said housing.

* * * * *

UNITED STATES PATENT AND TRADEMARK OFFICE
CERTIFICATE OF CORRECTION

PATENT NO. : 5,307,240

DATED : April 26, 1994

INVENTOR(S) : John F. McMahon

It is certified that error appears in the above-indentified patent and that said Letters Patent is hereby corrected as shown below:

Column 2; Line 17; Delete "." following "2"

Column 3; Line 28; Delete "," following "fins"

Column 4; Line 42; Insert --a-- following "has"

Signed and Sealed this

Twenty-first Day of November, 1995

Attest:

BRUCE LEHMAN

Attesting Officer

Commissioner of Patents and Trademarks